United States Patent [19]

Hollyday

[11] 4,267,536
[45] May 12, 1981

[54] STEPPED PIN POTTED FILTER ASSEMBLY

[75] Inventor: Robert D. Hollyday, Hershey, Pa.

[73] Assignee: AMP Incorporated, Harrisburg, Pa.

[21] Appl. No.: 21,059

[22] Filed: Mar. 16, 1979

Related U.S. Application Data

[63] Continuation of Ser. No. 838,189, Sep. 30, 1977, abandoned.

[51] Int. Cl.³ .................. H03H 7/01; H03H 1/00; H01R 19/22
[52] U.S. Cl. ........................ 333/186; 333/185; 339/147 R
[58] Field of Search ................ 333/181–184, 333/185; 339/136 R, 143 R, 147 R; 361/302, 306, 307

[56] References Cited

U.S. PATENT DOCUMENTS

| Re. 29,258 | 6/1977 | Fritz | 333/182 |
|---|---|---|---|
| 2,425,834 | 8/1947 | Salisbury . | |
| 3,134,950 | 5/1964 | Cook | 333/182 |
| 3,320,557 | 5/1967 | Garstang | 333/182 |
| 3,329,911 | 7/1967 | Schlicke et al. . | |
| 3,702,422 | 11/1972 | Schor | 333/182 X |
| 3,703,701 | 11/1972 | Zimmerman, Jr. | 339/221 R |
| 3,743,978 | 7/1973 | Fritz | 333/182 |
| 3,764,943 | 10/1973 | Fort | 339/147 R X |
| 3,930,210 | 12/1975 | Hollyday | 248/27 X |
| 3,961,294 | 6/1976 | Hollyday | 339/143 R X |
| 3,961,295 | 6/1976 | Hollyday et al. | 333/182 X |
| 4,053,199 | 10/1977 | Hollyday et al. | 339/147 R |

Primary Examiner—Marvin L. Nussbaum
Attorney, Agent, or Firm—Richard B. O'Planick; Jay L. Seitchik

[57] ABSTRACT

A filter assembly is disclosed having the capability of mating at opposite ends with electrical contacts of different dimensions. The subject assembly also allows the filter to be mounted in an aperture of a panel with minimal risk of damage to the filter.

5 Claims, 2 Drawing Figures

STEPPED PIN POTTED FILTER ASSEMBLY

This is a continuation of application Ser. No. 838,189, filed Sept. 30, 1977, now abandoned.

BACKGROUND OF THE INVENTION

1. The Field of the Invention

The present invention relates to electronic filters and in particular to a filter assembly the opposite ends of which mate with contacts of different dimensions.

2. The Prior Art

It has long been recognized that ceramic electronic filters have many inherent difficulties in assembly and mounting because of their extremely brittle nature. There have been a number of attempts to provide means whereby the ceramic electronic filter can be mounted in such a fashion as to reduce the risk of breakage. An example of such a mounting can be found in my U.S. Pat. No. 3,930,210. Other examples of filter mountings can be found in U.S. Pat. Nos. 3,702,422; 3,703,701; 3,961,294; and 3,961,295. An example of the type of ceramic filter in question may be found in U.S. Pat. No. 3,743,978.

SUMMARY OF THE INVENTION

The present invention resides in an assembly for mounting a ceramic electronic filter into a panel or the like for interconnection at the opposite ends thereof with terminals of different dimensions. The subject assembly includes a filter pin of stepped configuration, a cylindrical ceramic filter received over the pin, an eyelet or collar member received over the pin and a portion of the filter, and a sleeve which is received over the free end of the pin and secured thereto. The filter is soldered to the pin and the eyelet member is soldered to the filter. The blind annular cavity between the filter sleeve and the collar is subsequently filled with a potting material. The filter assembly can be soldered into an aperture with the collar or eyelet absorbing the mounting stresses.

It is therefore an object of the present invention to provide an improved stepped pin potted filter assembly which has a stepped configuration allowing interconnection at the opposite ends thereof with terminals of different dimensions.

It is a further object of the present invention to produce an improved stepped pin, potted filter assembly which will adequately protect the filter during the mounting process.

It is a further object of the present invention to produce an improved stepped pin potted filter assembly which can be readily and economically produced.

The means for accomplishing the foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
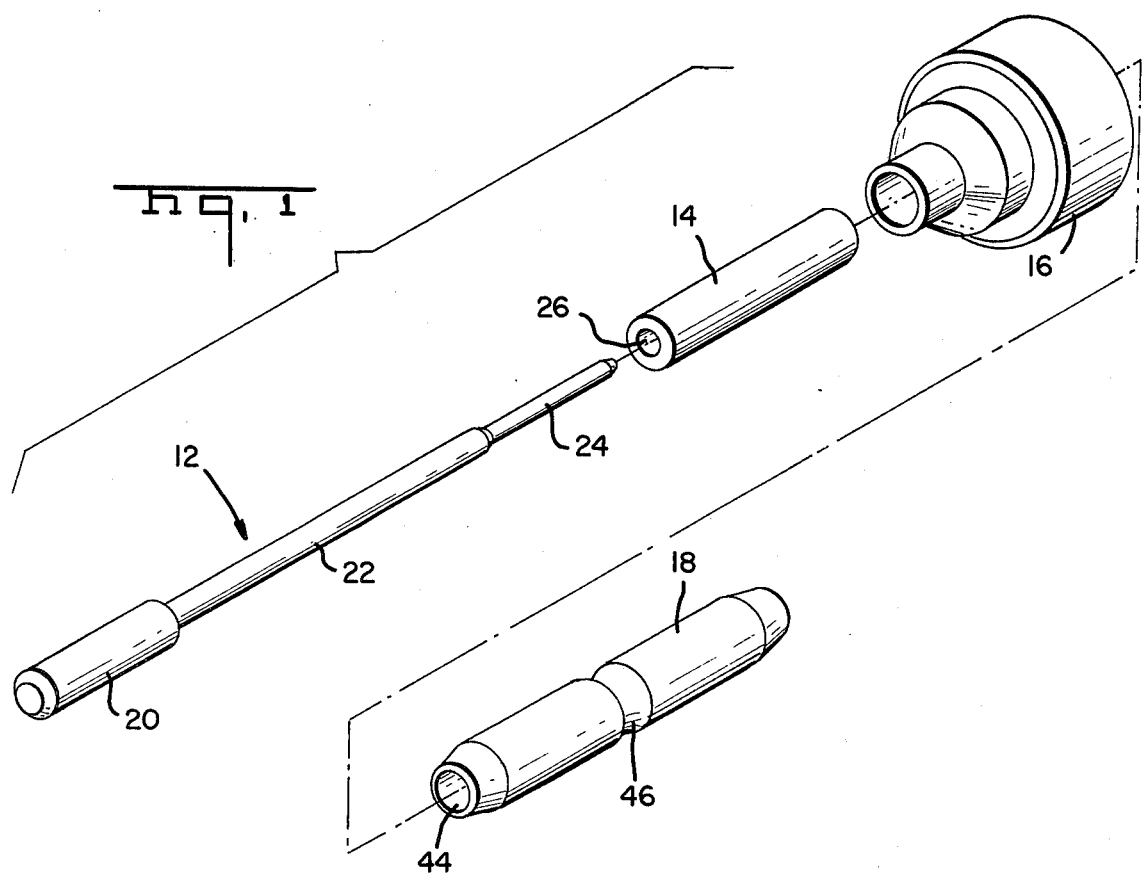
FIG. 1 is an exploded perspective view of the subject stepped pin potted filter assembly.

The subject stepped pin potted filter assembly 10 includes a profiled filter pin 12, a cylindrical filter 14, an eyelet or collar 16, and a sleeve 18. The pin 12 is profiled to have a first mating portion 20 of a large diameter, a second contiguous filter mounting portion 22 of a smaller diameter, and a third contiguous rear portion 24 of a still smaller diameter. The ceramic electronic filter 14 is cylindrical in shape and has a through bore 26 which receives therein the filter mounting portion 22 of pin 12. The filter preferably is of the type described in U.S. Pat. No. 3,743,978, the disclosure of which is incorporated herein by reference. The eyelet or collar 16 has a stepped configuration and includes a cylindrical nose portion 28, a first conical portion 30, a cylindrical mounting portion 32, a shoulder 34 and a cylindrical rear portion 36 and a profiled inner cavity 38. The nose portion 28 has an inner diameter comparable to the outer diameter of the filter 14. The mounting portion 30 preferably has a diameter approaching that of an aperture 40 in a panel or the like 42, in which the filter assembly is to be mounted. The step or shoulder 34 engages with the panel 42 in which the assembly is mounted. The sleeve 18 has an inner diameter 44 which receives rear portion 24 of the stepped pin 12 therein. The sleeve also has an intermediate annular depression 46 which engages the step between portions 22 and 24 of the pin 12 to position the sleeve on the pin.

The subject stepped pin potted filter assembly is made by first mounting filter 14 onto the portion 22 of pin 12 and soldering it in place. The nose 28 of the eyelet 16 is positioned over the filter 14 and likewise soldered in place. The sleeve 18 is next mounted on rear portion 24 of pin 12 until annular depression 46 engages the step between portions 22 and 24. The assembly is completed by filling the profiled, blind annular space 38 defined by the eyelet 16, filter 14 and sleeve 18, with a potting material 48. The potting material 48 can be selected from any of the well known materials such as epoxy, polyurethane, silicone rubbers, and the like.

Figure 2:
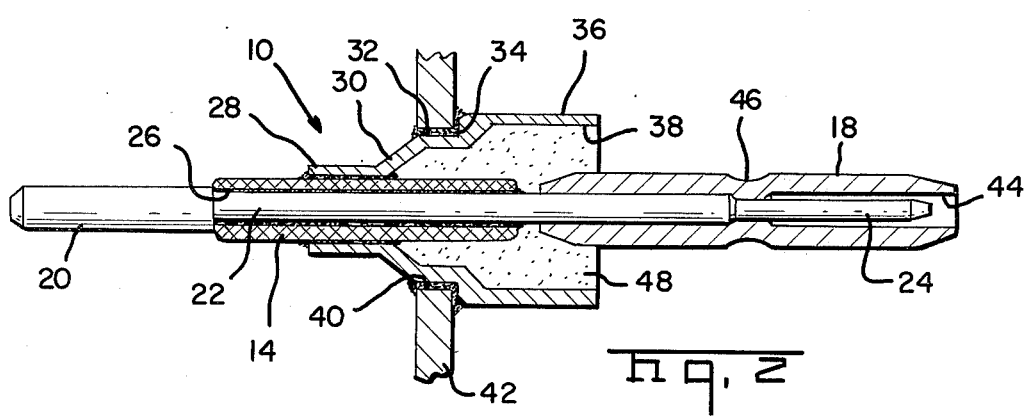
FIG. 2 is a side elevation, partially in section, of the subject stepped pin potted filter assembly in an assembled and mounted condition.

The completed assembly can be mounted in an appropriate aperture in a panel or housing and soldered in place. A fragment of such panel is shown in FIG. 2 and could be a mating face of an electrical connector (not shown) having a plurality of such apertures at least some of which are provided with filter assemblies according to the present invention.

The present invention may be subject to many modifications and changes without departing from the spirit or essential characteristics thereof. The present embodiment should therefore be considered in all respects as illustrative and not restrictive of the scope of the invention.

What is claimed is:

1. A stepped pin potted filter assembly comprising:

a pin having a stepped profile along the length thereof starting with a first mating end portion of a large diameter, a filter mounting portion of an intermediate diameter joined to said first mating end portion by a first annular step, and a rear end portion of small diameter joined to said filter mounting portion by a second annular step;

a cylindrical filter member having a bore receiving therein said intermediate diameter portion of said pin with an end of said filter member abutting against said first annular step;

a profiled cylindrical eyelet having a first portion closely fitting over said filter member and an enlarged second portion to the rear thereof defining a blind cavity;

a sleeve having a bore receiving therein said rear end portion of said pin and extending at least partially into said blind cavity, said sleeve having an outer diameter greater than said first mating end portion of said pin; and potting material filling said blind cavity defined by said eyelet.

2. A stepped pin potted filter assembly according to claim 1 wherein:

said enlarged portion of said eyelet includes means for mounting said assembly in an aperture.

3. A stepped pin potted filter assembly according to claim 2 wherein:

said mounting means comprises an annular step formed in said enlarged portion of said eyelet.

4. A stepped pin potted filter assembly according to claim 1 wherein:

said sleeve has an annular restriction in said bore, said annular restriction engaging a step of said pin to position said sleeve thereon.

5. A stepped pin potted filter assembly according to claim 1 wherein:

said potting material is selected from the group consisting of epoxy, polyurethane and silicone rubber.

* * * * *